United States Patent [19]

Nollet

[11] Patent Number: 4,767,952
[45] Date of Patent: Aug. 30, 1988

[54] HIGH SPEED CONTROL CIRCUIT FOR POWER FIELD EFFECT TRANSISTORS

[75] Inventor: Michel Nollet, Noisy Le Roi, France

[73] Assignee: Thomson-Lgt Laboratoire General des Telecommunications, Conflans Sainte Honorine, France

[21] Appl. No.: 937,356

[22] Filed: Dec. 3, 1986

[30] Foreign Application Priority Data

Dec. 13, 1985 [FR] France ................................ 85 18526

[51] Int. Cl.$^4$ ...................... H03K 17/687; H03K 3/01
[52] U.S. Cl. .................................... 307/571; 307/270; 307/297
[58] Field of Search ................................ 307/571–585, 307/270, 296.1, 296.6; 2/296 R; 330/269

[56] References Cited

U.S. PATENT DOCUMENTS

| | | | |
|---|---|---|---|
| 4,438,356 | 3/1984 | Fleischer | 307/571 |
| 4,461,966 | 7/1984 | Hebenstreit | 307/270 |
| 4,565,931 | 1/1986 | Fumey | 307/571 |
| 4,672,327 | 6/1987 | Wittlinger | 330/269 |

OTHER PUBLICATIONS

EP-A-0 053 709, (Siemens) *p. 3, ligne 28-p. 5, ligne 31; p. 7, lignes 6-36; FIGS. 2 et 4*.
DE-A-3 243 660, (Zumtobel AG), *p. 5, ligne 13-p. 9, ligne 17; FIG. 1*.

Primary Examiner—Stanley D. Miller
Assistant Examiner—B. P. Davis
Attorney, Agent, or Firm—Cushman, Darby & Cushman

[57] ABSTRACT

A circuit for high speed control a field effect power transistors. This circuit has a transformer with a primary winding and a secondary winding. The secondary winding transmits control signals to gates of the field effect power transistors. An energy storage structure is coupled to the transformer, and stores energy required for controlling the gates of the field effect power transistors. This energy is stored during an inactive phase of the control signal. A transmission structure is coupled to the transformer, and is fed with energy stored in the energy storage structure. In this way, the transmission structure uses energy stored in the energy storage structure to supply the control signals to the gates of the field effect power transistors. Therefore, the secondary of the transformer is not loaded during this time. At other times, the transmission structure isolates the output of the transformer from the rest of the circuit.

6 Claims, 2 Drawing Sheets

HIGH SPEED CONTROL CIRCUIT FOR POWER FIELD EFFECT TRANSISTORS

BACKGROUND OF THE INVENTION

The present invention relates to a high speed control circuit for power field effect transistors.

It applies to the construction of power supplies and chopping converters as well as to DC motor control devices.

The power transistors which are used in these applications must be able to switch rapidly, so as to reduce energy losses and increase the chopping frequency. The reduction of the energy losses increases the efficiency, simplifies the cooling systems and increases the reliability. Increasing the chopping frequency reduces the size and the price of the inductances of the transformers as well as of the capacitors used and increases the response speed of controlled systems.

However, the development of such devices is restrained by two main obstacles which limit the switching speed of the field effect transistors. This limiting factor is the high values of the input, gate-source $C_{GS}$ and drain-gate $C_{DG}$ capacities. The first capacitance ($C_{GS}$) is caused by a simple capacitive effective. The second is caused by Miller effect. These two capacities increase the rise times of the control signals applied to the gate inputs of the field effect transistors, and determine the time required for passing from the voltage $V_{GS(off)}$ for which the transistor is disabled to the voltage $V_{GS(on)}$ for which it is enabled.

To reduce the opening or closing time of a power field effect transistor, one known solution consists in increasing the current flowing through the gate of the transistor. It requires inserting a current amplifier with a high switching speed between the control circuit and the gate of the power transistor. However, this solution meets some matching difficulties when in ceertain constructions a galvanic insulation must be inserted between the control circuit and the gate. This situation is met with more particularly when, for a static DC power supply, for example, the configuration of the chopper is such that the source of one or more power transistors is brought to a high or variable potential or when, for safety reasons, it is necessary to isolate the chopper circuit from the mains by a photocoupler or by a transformer.

Although the photocoupler allows the signal to be transmitted in the information state, it has the disadvantage of having to be followed by a high speed amplifier fed by an energy source itself galvanically isolated, which complicates this type of construction.

A transformer, on the other hand, overcomes this drawback, but in order to be efficient it must have a reduced leakage inductance so as to have a response compatible with the control time of a few nanoseconds for power field effect transistors, which makes this type of construction expensive.

SUMMARY OF THE INVENTION

The aim of the invention is to overcome the above mentioned drawbacks

For this, the invention provides a high speed control circuit for power field effect transistors including a transformer with primary and secondary windings for transmitting control signals to the gates of the field effect transistors, and further including:

energy storage means coupled to the transformer for storing, on the appearance of the control signals, the energy required for controlling the gates of the field effect transistors, and transmission means coupled to the transformer and fed with energy by the storage means for applying the control signals, delivered by the transformers, with sufficient energy for controlling the gates of the field effect transistors.

BRIEF DESCRIPTION OF THE DRAWINGS

Other features and advantages of the invention will be clear from the following description with reference to the accompanying drawings which show.

DESCRIPTION OF THE PREFERRED EMBODIMENT

Figure 1:
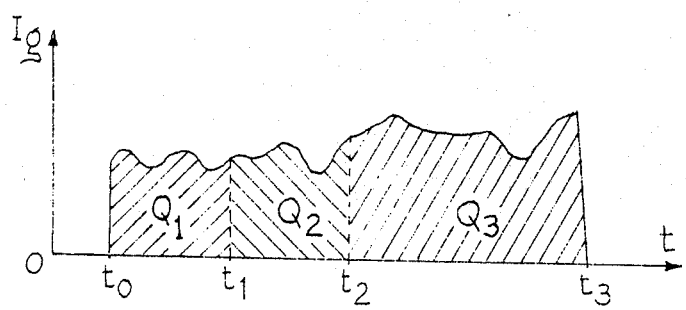
FIGS. 1 and 2, curves illustrating the behavior of a power field effect transistor when any control signal is applied to its gate electrode.
Figure 2:
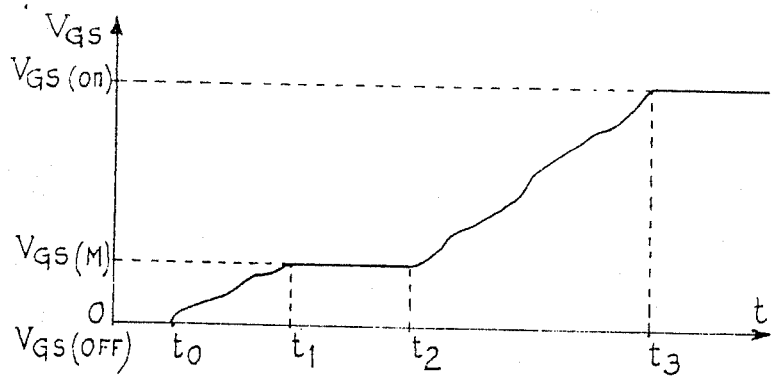

The curves shown in FIGS. 1 and 2 illustrate the general known evolution of the gate-source voltage $V_{GS}$ of a field effect transistor as a function of the gate current $I_g$ which is applied thereto by its external gate control circuit. These curves result from the fact that the two input capacities, gate-source $C_{GS}$ and drain-gate $C_{DG}$ of a transistor limit the drift $dV_{GS}/dt$ of the possible gate-source voltage $V_{GS}$ with respect to time t. Therefore these capacities determine the minimum time required for passing from a gate voltage $V_{GS(off)}=0$ to a gate voltage $V_{GS(on)}$, and the time for passing from the voltage $V_{GS(on)}$ to the voltage $V_{GS(off)}$ (switching on opening). The time for passing from $V_{GS(off)}$ to $V_{GS(on)}$ is, as a first approximation, equal to the sum of the charging time the input capacity $C_{GS}$ and of the discharging time of the drain-gate capacity $C_{DG}$. In FIGS. 1 and 2 the gate-source capacity $C_{GS}$ is charged between times $t_0$ and $t_1$ by receiving an amount of electricity $Q_1$ then, between times $t_2$ and $t_3$ by receiving an amount of electricity $Q_3$ and the drain-gate capacity is discharged between times $t_1$ and $t_2$ by restoring an amount of electricity $Q_2$.

Between times $t_o$ and $t_1$, the whole of the gate current $I_g$ passes through the gate-source capacity $C_{GS}$. At time $t_1$ the amount of electricity $Q_1$ stored in the gate-source capacity $C_{GS}$ confirms the equation:

$$Q_1 = \int_{t_0}^{t_1} I_g \cdot dt$$

Between times $t_1$ and $t_2$, the voltage $V_{GS}$ is stabilized by the Miller effect to the value $V_{GS(M)}$, the gate-source capacity $C_{GS}$ receives a zero current and the drain-gate capacity $C_{DG}$ receives the whole of the gate current $I_g$. At time $t_2$ the amount of electricity which is passed through the drain-gate capacity $C_{DG}$ confirms the equation:

$$Q_2 = \int_{t_1}^{t_2} I_g \cdot dt$$

Between times $t_2$ and $t_3$ the whole of the gate current $I_g$ flows through the gate-source capacity $C_{GS}$. Between $t_2$ and $t_3$ the amount of electricity stored in the gate-source capacity $C_{GS}$ confirms the equation $$Q_3 = \int_{t_2}^{t_3} I_g \cdot dt.$$

In the general case, with the function $I_g = f(t)$ unknown, it is not possible to calculate its primitive $\int I_g \cdot dt$. But since the initial and final stage $t_o$ and $t_3$ are themselves defined and since as a first approximation the current $I_g$ may be considered as substantially constant in these intervals, it is possible to admit $$\int_{t_0}^{t_1} I_g \cdot dt = [\epsilon_{1g}]_{t_0}^{t_1} = I_{1g}(t_1 - t_0)$$

$$\int_{t_1}^{t_2} I_g \cdot dt = [\epsilon_{2g}]_{t_1}^{t_2} = I_{2g}(t_2 - t_1)$$

$$\int_{t_2}^{t_3} I_g \cdot dt = [\epsilon_{3g}]_{t_2}^{t_3} = I_{3g}(t_3 - t_2)$$

$\epsilon_{1(g)}$, $\epsilon_{2(g)}$, and $\epsilon_{3(g)}$ are respective primitives of the functions $I_{g(t)}$ defined in the intervals $t_o$ to $t_1$, $t_1$ to $t_2$ and $t_2$ to $t_3$. $I_{1g}$, $I_{2g}$ and $I_{3g}$ are the mean gate currents between $t_o$ and $t_1$, $t_1$ and $t_2$, $t_2$ and $t_3$. These time intervals are defined by the relationships:

$$t_1 - t_0 = \frac{Q_1}{I_{1g}} = \frac{V_{GS(M)} \cdot C_{GS}}{I_{1g}}$$

$$t_2 - t_1 = \frac{Q_2}{I_{2g}} = \frac{V_{DS(off)} \cdot G_{GD}}{I_{2g}}$$

$$t_3 - t_2 = \frac{Q_3}{I_{3g}} = \frac{V_{GS(on)} - V_{GS(M)} C_{GS}}{I_{3g}}$$

The total switching time is therefore equal to $t_c = t_3 - t_o$ and equal to $t_3 - t_2 + t_2 - t_1 + t_1 - t_o$ or else:

$$t_c = \frac{V_{GS(M)} \cdot C_{GS}}{I_{1g}} + \frac{V_{DS(off)} C_{GD}}{I_{2g}} + \frac{V_{GS(on)} - V_{GS(M)} C_{GS}}{I_{3g}}$$

The whole of these relationships shows that the times required for opening or closing the field effect transistor may be reduced by increasing the value of the mean current $I_{2g}$.

But the dispersions of the voltage $V_{GSth}$ which represents the threshold gate-source voltage, on the one hand, and the need for rapid immunity to noise on closure as on opening, on the other hand, lead also to increasing the values of the mean currents $I_1(g)$ and $I_3(g)$.

Thus, in order to profit from one of the main advantages of a field effect transistor conferred by its high speed, it is necessary to give up the important advantage provided by its voltage control facilities. By taking for example the case of a type IRF350 transistor and taking into account the fact that its gate-source $C_{GS}$ and drain-source $C_{DS}$ capacities cannot be considered as constant for voltages $V_{DS}$ between 0 and 50 volts, the amount of electricity to be applied to the gate in order to obtain complete switching is $Q_1 + Q_2 + Q_3 = Q_c = 120$ nanocoulombs. To provide switching under these conditions in a time $(t_3 - t_o) \leq 60$ nanoseconds, the current must be equal to $$I_g = \frac{Q_C}{t_3 - t_0} = \frac{120 \text{ nanocoulombs}}{60 \text{ nanoseconds}} = 2 \text{ amperes}.$$

Figure 3:
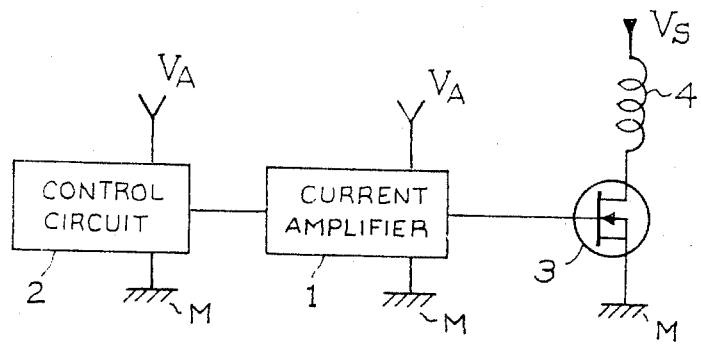
FIG. 3: the known organization for controlling a field effect power transistor.

This means, in known solutions, that high speed switching current amplifiers 1 must be inserted between the control circuits 2 of the field effect power transistors 3 in the way shown in FIG. 3, fed between a voltage potential $V_A$ and a ground circuit M. But these solutions, when they are used by providing galvanic insulation by means of a transformer, are costly. Furthermore, the leakage inductances L of the transformers must be reduced as much as possible so as to be compatible with the control times of a few tens of nanoseconds for field effect transistors.

The solution proposed by the invention consists in inserting between each transformer and field effect power transistor signal receiver at least one element which:

1. Demands energy of the transformer during the non significant phases of the signal and stores this energy, 2. Receives the significant phases of the signal while presenting an infinite impedance without consequently requesting energy from the transformer and without affecting the signal and finally 3. Transmits the signal with the energy required to the receiver considered, this energy being taken from the stock of energy formed during the non significant phases of the signal.

Figure 4:
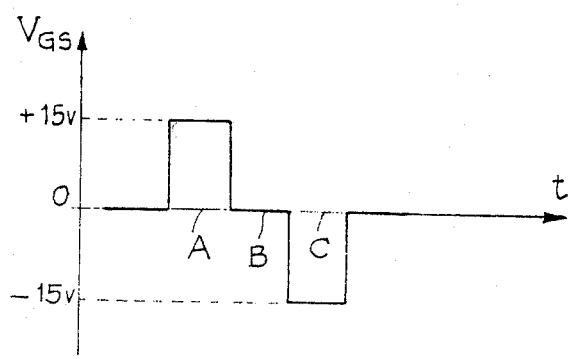
FIG. 4: a representation of a control signal.
Figure 5:
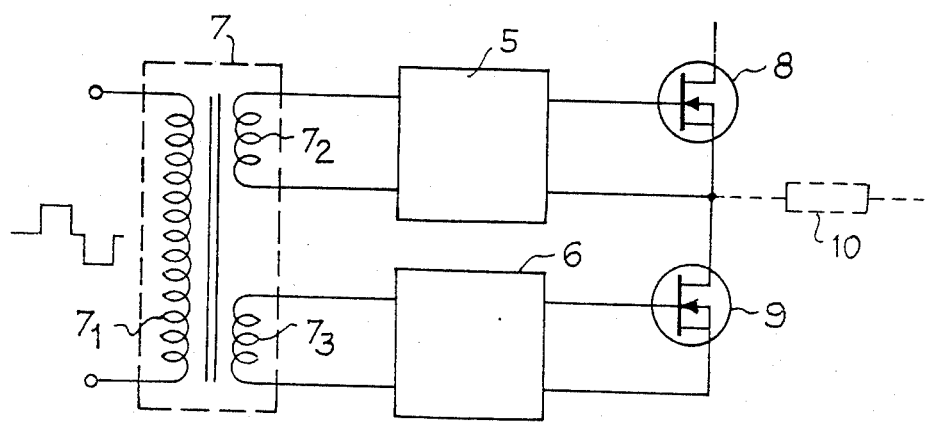
FIG. 5: a constructional diagram of a control device with a transformer of the "push-pull" type with two field effect power transistors.

This principle may not only be applied to the construction of the signal receiving controls using the devices of the invention inserted between a secondary winding of a transformer delivering the control signal and each signal receiving device, but may also be applied, as is shown in FIG. 5, to several devices 5, 6 of the invention interposed between signal receivers formed by two series mounted "push-pull" transistors 8, 9 feeding into a common load 10 shown with broken lines; and secondary windings referenced respectively $7_2$ and $7_3$ of transformers 7 whose primary $7_1$ is controlled by rectangular type signals, of the form of the one shown in FIG. 4, having positive and negative half waves during time intervals A and C respectively and a zero amplitude during a time interval B intermediate between the intervals A and C.

Figure 6:
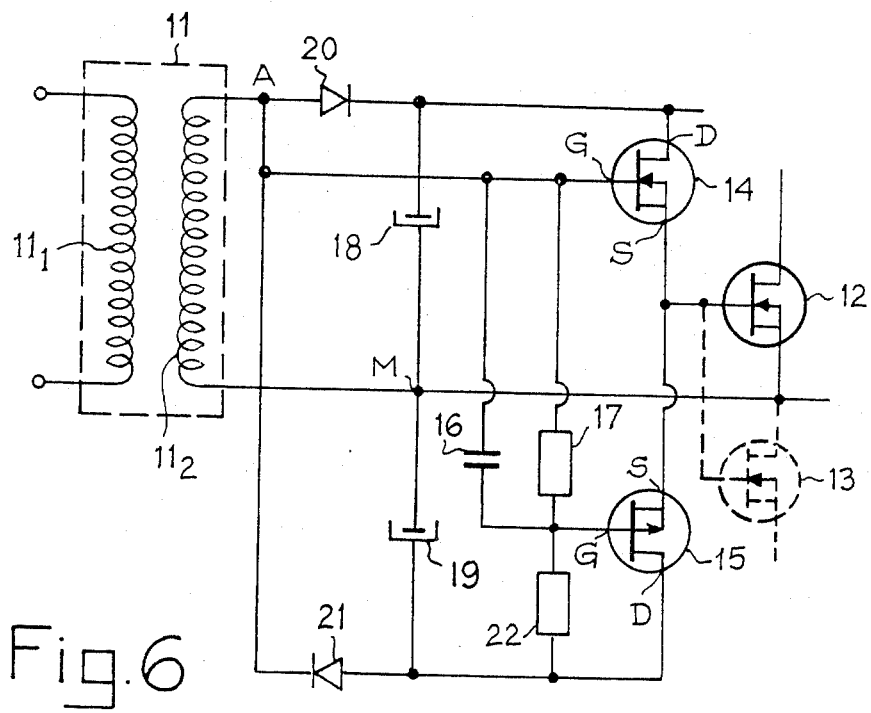
FIG. 6: an example of construction of a high speed control circuit with power field effect transistors of the invention.

One embodiment of the circuits 5 and 6 is shown in FIG. 6.

The circuit of the invention which is shown in FIG. 6 is placed between a signal transformer 11 having a primary and a secondary winding referenced respectively $11_1$ and $11_2$, and a signal receiver shown in FIG. 6 by a half stage 12 of a power series "push-pull", the other half stage 13 being shown in broken lines. The power receiver is controlled by two series connected "mosfet" stages 14 and 15 one of whose gates are connected directly to a terminal A of the secondary winding $11_2$, and the other gate connected through a capacitor 16 and a resistor 17 connected in parallel. Capacitors 18 and 19 are connected in parallel to the terminals of the secondary $11_2$ through two diodes 20 and 21 connected respectively by an anode and a cathode to the terminal A so as to form with capacitors 18 and 19 a voltage doubler.

Assuming that a signal of the type shown in FIG. 4 is applied to the primary $11_1$ of transformer 11, the operation of the circuit shown in FIG. 6 is as follows. This signal appearing at the terminals of the secondary winding $11_2$ charges capacitors 18 and 19 during the times marked A and C of FIG. 4 through diodes 20 and 21 to their peak values respectively. Transistors 14 and 15 are closed (OFF) respectively during the time intervals A and C of the signal. The charging currents for capacitors 18 and 19 are zero during the rising and falling fronts of the signal which under these conditions is not affected. The energy required for operation of transistors 14 and 15, which are connected as a follower source is then supplied by capacitors 18 and 19 which are then isolated from the secondary $11_2$ by the diodes 20 and 21 during the significant phases of the signal, the transistors 14 and 15 being open respectively during the time interval C and A. Thus, no energy is taken from the transformer during the significant phases of the signal. To make the circuit of the invention even more efficient, it will be possible to choose the input capacities of transistors 14 and 15 so that they are substantially a hundred times smaller than that of the power transistors 12 for resolving the rise and damping time problems. Similarly, the values of resistors 17, 22 and capacitor 16 will be chosen for efficiently biasing the transistor 15 so as to compensate for the threshold voltages $V_{GSth}$ and for lowering the plateau of the signal below the voltage 0 so as to increase the immunity to noise.

What is claimed is:

1. A high speed control circuit, comprising:
   a transformer having a primary winding coupled to receive an input signal and a secondary winding which produces at least one control signal based on said input signal;
   energy storage means, coupled to said secondary winding of said transformer, for storing energy during at least one inactive phase of said at least one control signal;
   electronic network means, coupled to said secondary of said transformer and to said energy storage means, for receiving said control signals, and producing output signals which are powered substantially only by energy stored in said energy storage means, said output signals being produced during an active phase of said at least one control signal, and being isolated from said secondary of said transformer during said active phases of said at least one control signal; and
   at least one transistor, having a gate terminal coupled to receive said at least one control signal.

2. A circuit for high speed control of at least one field effect power transistor which has a control gate, comprising:
   a transformer with a primary winding for receiving an input signal, and a secondary winding for transmitting a control signal based on said input signal to said control gate of the field effect power transistor, said control signal having alternately assuming a first voltage level and a second voltage level opposite in sense to the first voltage level;
   energy storage means, coupled to said secondary winding, for storing energy required for controlling said field effect power transistor during a first time when the control signal is at its first voltage level;
   transmission means, coupled to said secondary winding and fed only by said energy storage means, for transferring energy stored in the energy storage means to the control gate of said field effect power transistor only during a second time when said control signal is set at its second voltage level; and
   isolating means coupled between said secondary winding and said energy storage means, for inhibiting the transfer of energy from said secondary winding to said energy storage means and to said transferring means during said second time when the control signal is set at its second voltage level.

3. The circuit as claimed in claim 2 wherein said energy storage means comprises at least one capacitor connected in parallel to said secondary winding of the transformer through said isolating means.

4. The control circuit as claimed in claim 3, wherein said transmission means is formed by at least one field effect transistor, having drain and source electrodes respectively coupled to terminals of said capacitor, the source electrode being also connected to said control gate of said power transistor, and said field effect transistor having a gate electrode connected to said secondary winding, for receiving said control signal.

5. The control circuit as claimed in claim 2 wherein there are at least two field effect transistors serially connected and wherein said transmission means is formed by a "push pull" type stage formed by two complementary field effect transistors connected in series and having source electrodes which are connected together and to at least one gate of the field effect power transistor, and said energy storage means includes a plurality of energy storage elements, one coupled to each of said complementary field effect transistor.

6. The control circuit as claimed in claim 2 wherein said isolating means comprise at least one diode serially connected between said secondary winding and said energy storage means.

* * * * *